(12) United States Patent
Rangarajan et al.

(10) Patent No.: US 7,943,289 B2
(45) Date of Patent: May 17, 2011

(54) INVERSE RESIST COATING PROCESS

(75) Inventors: Bharath Rangarajan, Santa Clara, CA (US); Michael K. Templeton, Atherton, CA (US); Ramkumar Subramanian, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 929 days.

(21) Appl. No.: 11/087,011

(22) Filed: Mar. 22, 2005

(65) Prior Publication Data

US 2005/0164133 A1  Jul. 28, 2005

Related U.S. Application Data

(62) Division of application No. 09/973,240, filed on Oct. 9, 2001, now abandoned.

(51) Int. Cl.
*G03F 7/20* (2006.01)
(52) U.S. Cl. .................. 430/322; 430/323; 430/324
(58) Field of Classification Search .................. None
See application file for complete search history.

(56) References Cited

U.S. PATENT DOCUMENTS

| | | | |
|---|---|---|---|
| 4,068,018 A * | 1/1978 | Hashimoto et al. | 430/5 |
| 4,119,483 A | 10/1978 | Hubsch et al. | |
| 4,224,361 A | 9/1980 | Romankiw | |
| 5,223,914 A | 6/1993 | Auda et al. | |
| 5,294,291 A | 3/1994 | Akahoshi et al. | |
| 5,374,503 A * | 12/1994 | Sachdev et al. | 430/323 |
| 5,756,256 A | 5/1998 | Nakato et al. | |
| 5,840,199 A | 11/1998 | Warren | |
| 5,866,281 A * | 2/1999 | Guckel et al. | 430/22 |
| 5,902,493 A * | 5/1999 | Bae | 438/703 |
| 5,905,020 A | 5/1999 | Hu et al. | |
| 6,107,172 A | 8/2000 | Yang et al. | |
| 6,221,562 B1 | 4/2001 | Boyd et al. | |
| 6,492,068 B1 | 12/2002 | Suzuki | |
| 6,737,198 B2 | 5/2004 | Kamon | |
| 2001/0033998 A1 | 10/2001 | Fujio | |

FOREIGN PATENT DOCUMENTS

| | | |
|---|---|---|
| EP | 425 957 | 5/1991 |
| EP | 753 764 | 1/1997 |

OTHER PUBLICATIONS

Toyoshima, Toshiyuki, et al. "01. um Level Contact Hole Pattern Formation with KrF Lithography by Resolution Enhancement Lithography Assisted by Chemical Shrink (RELACS)," IEDM 98 333-336.
International Search Report for PCT/US01/51280 dated Oct. 24, 2002.

* cited by examiner

*Primary Examiner* — Daborah Chacko Davis
(74) *Attorney, Agent, or Firm* — Turocy & Watson, LLP

(57) ABSTRACT

The invention provides systems and processes that form the inverse (photographic negative) of a patterned first coating. The patterned first coating is usually provided by a resist. After the first coating is patterned, a coating of a second material is provided thereover. The uppermost layer of the second coating is removed, where appropriate, to expose the patterned first coating. The patterned first coating is subsequently removed, leaving the second coating material in the form of a pattern that is the inverse pattern of the first coating pattern. The process may be repeated with a third coating material to reproduce the pattern of the first coating in a different material. Prior to applying the second coating, the patterned first coating may be trimmed by etching, thereby reducing the feature size and producing sublithographic features. In addition to providing sublithographic features, the invention gives a simple, efficient, and high fidelity method of obtaining inverse coating patterns.

20 Claims, 6 Drawing Sheets

INVERSE RESIST COATING PROCESS

CROSS REFERENCE TO RELATED APPLICATION

This application is a divisional of U.S. application Ser. No. 09/973,240, entitled Inverse Resist Coating Process and filed on Oct. 9, 2001 now abandoned, the entirety of which is incorporated herein by reference.

TECHNICAL FIELD

The present invention generally relates to semiconductor processing, and in particular to a lithographic process and system for producing patterned coatings having reduced feature sizes.

BACKGROUND OF THE INVENTION

In the semiconductor industry, there is a continuing trend toward higher device densities. To achieve these high densities there has been, and continues to be, efforts toward scaling down the device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution lithographic processes. In general, lithography refers to processes for pattern transfer between various media. It is a technique used for integrated circuit fabrication in which a silicon slice, the wafer, is coated uniformly with a radiation-sensitive film, the resist. The film is exposed with a radiation source (such as optical light, x-rays, or an electron beam) that irradiates selected areas of the surface through an intervening master template, the mask, forming a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the mask causes the image area to become either more or less soluble (depending on the coating) in a particular solvent developer. The more soluble areas are removed in the developing process to leave the pattern image in the coating as less soluble polymer.

Lithographic processes are generally limited as to minimum feature size. These limitations are primarily based on the type of resist used and the wavelength of exposing radiation. The usefulness of existing lithographic processes would be improved if these limitations could be overcome. There has been an unsatisfied need for a process that overcomes feature size limitations and permits the patterning or formation of extremely small (sub-micron) sub-lithographic features, especially using currently available resist materials and radiation sources.

SUMMARY OF THE INVENTION

The invention provides systems and processes that form the inverse (photographic negative) of a patterned first coating. The process employs a patterned first coating, which is usually provided by a resist. After the first coating is patterned, a coating of a second material is provided thereover. The uppermost layer of the second coating is removed, where appropriate, to expose the patterned first coating. The patterned first coating is subsequently removed, leaving the second coating material in the form of a pattern that is the inverse pattern of the first coating pattern. The process may be repeated with a third coating material to reproduce the pattern of the first coating in a different material. Prior to applying the second coating, the patterned first coating may be trimmed by etching, thereby reducing the feature size and producing sublithographic features. Another option to reducing feature sizes is to trim the second coating. In addition to providing sublithographic features, the invention gives a simple, efficient, and high fidelity method of obtaining inverse coating patterns. Furthermore, the invention can be used to form a high resolution pattern using a high resolution coating material and then replace the high resolution coating material with another material having superior properties, such as superior dry etch resistance, while retaining the high resolution pattern.

In one aspect, the invention provides a method of processing a substrate including the steps of forming a first coating including a resist material on a substrate surface, irradiating and developing the first coating to form a patterned first coating on the substrate surface, forming a second coating over the substrate surface, removing the patterned first coating while leaving the second coating to form a pattern on the substrate that is approximately the negative of the pattern formed by the first coating prior to its removal, and using the patterned second coating as a protective layer while subjecting the substrate to further processing.

In another aspect, the invention provides a method of process a semiconductor substrate including steps for forming a patterned first coating, forming a second coating with a pattern that is the negative of the first coating pattern, and selectively etching the substrate surface where the second coating is absent In a further aspect, the invention provides a method of forming sublithographic features in a substrate including the steps of forming a patterned first coating on a substrate by coating the substrate with a resist, exposing and developing the resist, etching the first coating to form a modified pattern that has features that are sublithographic for the resist and method of exposure used to form the patterned first coating, forming a second coating over at least that portion of the substrate surface not covered by the patterned first coating, removing the patterned first coating while leaving the second coating to form a pattern that is approximately the negative of the pattern formed by the first coating after etching, and etching the substrate using the second coating as a mask.

In another further aspect, the invention provides a system for forming and/or using an inverse resist coating containing elements required to form a first patterned coating and a second patterned coating; a measuring system for measuring at least one operating parameter while making or using the first patterned coating and second patterned coating; and a processor operatively coupled to the measuring system and at least one of the formation/use elements, the processor receiving operating parameter data from the measuring system and the processor using the data to control at least one of the elements to form or use the inverse resist coating.

DETAILED DESCRIPTION OF THE INVENTION

Figure 1:
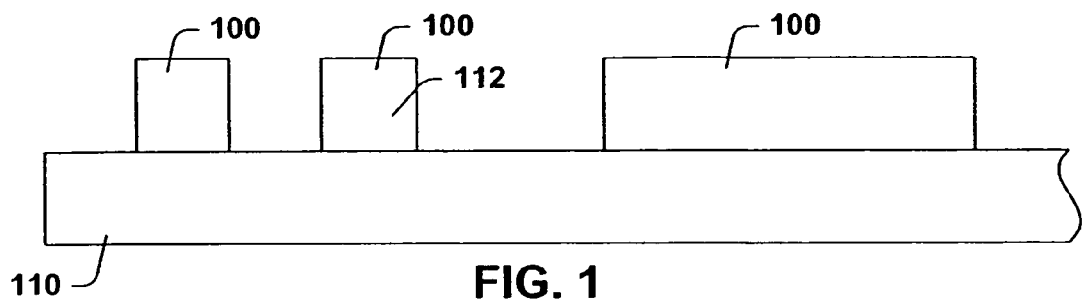
FIG. 1 is a cross-sectional illustration of a substrate with a patterned first coating according to one aspect of the present invention.

The present invention provides methods and systems of forming the inverse of a patterned first coating. A patterned coating is usually produced using a radiation sensitive resist material. The resist is coated on a substrate, irradiated through a mask, and then developed. Irradiation makes the exposed portion of the resist more or less soluble than the unexposed portion of the resist, depending on the tone of the resist. For example, in the case of a positive tone resist, the exposed portion of the resist becomes more soluble in a developing solution. After development, a positive tone resist forms a pattern similar to that of the mask. Using the invention, however, the inverse pattern may be obtained, i.e., a pattern that is the negative of the mask pattern in the case using a positive tone resist for the first coating and a pattern that is similar to the mask in the case using a negative tone resist for the first coating. In some embodiments, an inverse pattern having sublithographic features may be obtained. Thus, the inverse pattern, or its negative, made in accordance with the present invention may have features that are lithographic or sublithographic in size compared to the features initially formed into the first coating.

The first coating is formed over a substrate, which is typically a semi-conducting material, such as silicon. In addition to a semiconducting material, the substrate may include various elements and/or layers; including metal layers, barrier layers, dielectric layers, device structures, active elements and passive elements including silicon gates, word lines, source regions, drain regions, bit lines, bases emitters, collectors, conductive lines, conductive plugs, etc.

The first coating typically includes a resist. The resist material may be organic or inorganic. The resist may be a photoresist responsive to visible light, ultraviolet light, or x-rays, or the resist may be an electron beam resist or an ion beam resist. Positive or negative tone resists may be used, but the first coating is generally a positive tone resist. An advantage of using a positive tone resist as the first coating is that it may later be removed in its entirety by unmasked exposure of the resist to actinic radiation followed by treatment with the developer.

The first coating may include one or more layers. In one example of a multi-layered first coating, the first coating includes a planarizing layer below a resist layer. A planarizing layer provides a flat surface on which to form subsequent layers. A resist layer with uniform thickness is easier to form over a flat (planar) surface than over a comparatively uneven surface. Uniform thickness in a resist layer generally increases the fidelity of pattern transfer. Additional layers may also be used to enhance the contrast between exposed and unexposed regions, giving features with steeper and sharper edges.

The first coating may be applied to any suitable thickness. On the one hand, a thicker than normal first coating may be desirable to accommodate subsequent optional trim steps to reduce feature size. On the other hand, if the substrate is subsequently etched using the second or third coating as a mask, the mask function of the second or third coating may dictate a minimum thickness, and that minimum thickness may be less than that which is typical for etch processes using the material of the first coating. Therefore, the first coatings of the invention may be thicker or thinner than similar resist coatings that are not used in processes of the invention.

Accordingly, in one embodiment, the thickness of the first coating is from about 200 Å to about 20,000 Å. In another embodiment, the thickness of the first coating is from about 500 Å to about 10,000 Å. In a further embodiment, the thickness of the first coating is from about 100 Å to about 2,000 Å.

The first coating may be formed on the substrate surface by any suitable means. Spin coating, dip coating, or vapor deposition may be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the substrate surface. The photoresist may be chemically amplified. Photoresists are commercially available from a number of sources, including Shipley Company, Kodak, Hoechst Celanese Corporation, Clariant, JSR Microelectronics, Hunt, Arch Chemical, Aquamer, and Brewer. Examples of suitable positive-tone resists for the first coating include novalacs, poly-t-butoxycarbonyloxystyrenes (TOBC), poly-methylmethacrylates (PMMA), poly(olephin sulfones) (POS), and poly(methyl isophenyl ketones) (PMIPK), After the first coating is applied to the substrate surface, the coated substrate may be soft baked to drive off excess solvent, increase adhesion of the first coating to the substrate surface, and/or induce polymerization. Soft baking involves heating at an elevated temperature for a suitable period of time. By way of example, the coated substrate may be heated to a temperature above about 60° C. for at least about 10 seconds.

In the typical case where the first coating includes a resist material, the resist coated substrate is selectively exposed to actinic radiation to cause a chemical transformation in desired regions of the resist. The type or wavelength of radiation employed depends primarily upon the identity of the resist. A mask is typically employed to selectively expose the resist. Optionally, the exposed resist may then be contacted with a resist activating solution to improve the subsequent development of the resist. The resist is then developed to form a pattern. Development is generally accomplished with a solvent that selectively removes a portion of the resist. An aqueous alkali solution is a suitable developer for many positive tone resists and negative tone resists and specifically an aqueous tetramethylammonium hydroxide is frequently employed as a developer. Negative tone resist may require organic solvent developers. When the first coating is composed of multiple layers, the pattern is ordinarily formed through all the layers. This may require multiple exposing and developing steps. As a result of these developing steps, portions of the underlying substrate are exposed (no longer covered by the first coating).

The patterned first coating has a minimum feature size, which primarily depends on the type of coating material and the method of creating the pattern. Feature size may refer, for example, to the minimum width of a gap or line or the minimum diameter of a via or hole. With photoresists, the minimum feature size depends on the wavelength of the radiation used to expose the resist. Shorter wavelengths generally give a smaller minimum feature size. Minimum feature sizes for photoresists are typically about 0.18 µm, 0.25 µm, 0.5 µm, or greater. The minimum feature size for a novolac resist is typically about 0.5 µm. The minimum feature size for a deep-UV PMMA resist can be as low as about 0.18 µm. Sublithographic features are features below the minimum size for a particular resist patterned using a particular type of radiation.

After preparation of the patterned first coating, there follows an optional step that can facilitate generating patterns with sublithographic features. This is a primarily lateral etch (trim) step. Etching may be accomplished by any suitable means including physical means, chemical means, or a combination of the two. Physical etching can include glow-discharge sputtering or ion beam milling. Physical etching is comparatively non-selective as to the type of material removed. Depending on the composition of the first coating, reactive ion etching (RIE) or plasma etching may also be used. Examples of gases that may be used in etching the first coating material include, oxygen, fluorine compounds, such as carbon tetrafluoride, chlorine compounds, such as $Cl_2$, hydrogen, inert gases, or a combination of two or more the foregoing. Wet etching is also permissible using, for example, an acid, a base, or a solvent. Acids that may be used include hydrofluoric acid, hydrobromic acid, nitric acid, phosphoric acid or acetic acid. Bases that may be used include hydroxides such as sodium hydroxide, ammonium hydroxide, and potassium hydroxide. Solvents may be polar, such as water, or non-polar, such as xylene or cellusolve, or of intermediate polarity, such as alcohols including methanol. Selection of a suitable etching material depends primarily on the identity of the first coating material, and to some extent, the composition of the substrate.

The optional trim step can be use to trim pattern features, thereby reducing their width and thickness. Feature sizes may be reduced to about 10% of their original size. In one embodiment, feature sizes are reduced from about 10% to about 90% of their original size. In another embodiment, feature sizes are reduced from about 25 to about 75% of their original size. Typically, the features that are diminished in size are lines in the first coating. These are used to produce gaps of corresponding width in the second coating. The gaps in the second coating may be used to etch lines of corresponding size in the underlying substrate.

After patterning the first coating, a second coating is formed on the substrate covering those portions of the substrate surface not covered by the patterned first coating. Many options are available for the material of the second coating, although suitable choices depend on the identity of the material or materials making up the first coating. The second coating material may be a positive tone resist, a negative tone resist, or a material that is not a resist (such as an oxide or nitride). The second coating material may be polymeric, glassy, or crystalline. The second coating material may be organic or inorganic. The second coating may be applied by any suitable means, including chemical vapor deposition, spin coating, and dip coating.

When the second coating material is applied to the substrate as a solution that is later cured, the solution is usually selected so that it does not substantially dissolve the material of the first coating. Preferably, the solvent system for the second coating has little or no effect on the first coating. For example, in embodiments where the material of the first coating includes novolac or exposed TOBC, aqueous alkali solvent systems are generally avoided. In embodiments where the first coating material is PMMA, POS, or unexposed TOBC, organic solvent systems are generally avoided. Exposure of TOBC to actinic radiation changes its solubility from solubility in non-polar organic solvents to solubility in aqueous alkali.

The second coating contains a material that has, or can develop, a different solubility from the first coating. A difference in solubility may be developed, for example, by exposing a first coating containing a positive tone photoresist to actinic radiation after application of the second coating.

In view of the forgoing, an appropriate choice for the second coating material may depend in part on the identity of the first coating. Novolac and exposed TOBC first coatings allow a wide range of choices for the second coating material. Choices include polysiloxanes, fluoropolymers, polystyrene, PMMA, novalac, TOBC, PMIPK, and poly(olefin sulfones), to name a few. Polysiloxanes have an advantage of high resistance to dry etching with oxygen. Fluoropolymers have an advantage of high resistance to dry etching with chlorine. Negative tone resists can be used without concern for swelling problems, since the second coating need not be exposed to developer, except perhaps in the situation where the entire second coating is being removed, e.g., after forming a patterned third coating as described below.

First coatings based on PMMA or POS also place few limitations on the identity of the second coating material. Choices include polysiloxanes, fluoropolymers, polystyrenes, TOBC, and novalacs. PMMA and POS are useful in producing high resolution lithographic patterns, but have relatively poor etch resistance. Using methods of the invention, a high resolution pattern may be formed using one of these or another resist material and then transferred to another material that has substantially higher etch resistance, such as a polysiloxane or a fluoropolymer. The transferred pattern may be the negative of the high resolution pattern, or it may be substantially the same pattern if the high etch resistance material is a third coating material as described below.

In many instances, upon formation, the second coating covers the patterned first coating and a portion of the second coating, and perhaps some of the first coating, is removed to make the first and second coating generally co-planar, thereby exposing the patterned first coating and developing the inverse pattern in the second coating. This may be referred to as a planarizing step. After planarization, the second coating covers only that portion of the substrate surface that the first coating did not cover. Planarization can be accomplished by chemical, mechanical, or by combined chemical mechanical means.

Chemical planarization includes removal of material with a reactive chemical or a solvent. Example of chemical planarization include plasma and reactive ion etching. The plasma can be of oxygen, fluorine, chlorine, hydrogen, or a combination of these, optionally with other gases. Reactive ion etching can be done with oxygen, for example Combined chemical and mechanical means include chemical mechanical polishing (CMP). CMP uses a material, often referred to as a slurry, that does not rapidly dissolve the coating, but modifies its chemical bonding sufficiently to facilitate mechanical removal with a polishing pad.

Planarization can also be accomplished by purely mechanical means. A polishing pad attached to a rigid flat surface can be moved against the upper layer to gradually remove an amount of material appropriate to expose the patterned first coating. An advantage of mechanical removal is that it is not always necessary for the second coating material to be susceptible to any type of chemical etching and it is not always necessary to take into account the different chemical susceptibilities of the first and second coating materials.

After forming the second coating in the openings left by the patterned first coating, the patterned first coating is removed without substantially damaging the second coating. The patterned first coating may be removed in any manner that does not substantially remove the second coating material. Typically, the patterned first coating is removed with a solvent. For example, in embodiments where the first coating is a positive tone resist it may be removed with the developer after irradiation, provided that the second coating material is comparatively insoluble in the developer. Novolacs and TOBC may be removed with aqueous alkali. PMMA and POS and unexposed TOBC may be removed with non-polar organic solvents such as hexane or cellosolve.

After the patterned first coating is removed, the second coating material forms the inverse pattern of the first coating. This inverse pattern may be used as a mask to selectively etch the substrate. In embodiments where the optional step of trimming the first coating is employed, the inverse pattern may have smaller features than the pattern formed in the first coating material. Feature sizes may be reduced to about 10% of corresponding features in the original first coating pattern. In one embodiment, feature sizes are reduced from about 10 to about 90% of their original size. In another embodiment, feature sizes are reduced from about 25 to about 75% of their original size. For example, using a novolac as the first coating material with initial feature sizes of about 0.05 µm, features of about 0.025 µm size can be produced. Using a deep-UV PMMA resist with initial feature sizes of about 0.018 µm, features of about 0.009 µm size can be produced.

The process may be repeated using the second coating material in place of the first patterned coating. In other words, a third coating may be applied over the patterned second coating, the third coating planarized, if appropriate, to expose the patterned second coating, the second coating may then be removed leaving the third coating to form the inverse image of the second coating. The pattern formed by the third coating is similar to that of the first coating. The third coating therefore replaces the patterned first coating, but may be of a different material, such as one that has a better resistance to dry etching. An optional trim step may be applied to the second coating to provide the patterned third coating with smaller features as compared to those of the patterned first coating.

The considerations in selecting the composition of the third coating are the same as those discussed above for the selection of the second coating, keeping in mind that the second coating is to the third coating what the first coating is to the second coating.

Example I

A process according to one aspect of the invention including an optional trim step is illustrated in FIGS. 1 to 5. FIG. 1 illustrates substrate 110 with patterned first coating 100. In this example, patterned first coating 100 is a positive tone resist that has an aqueous alkali developer. For example, patterned first coating 100 can be a novolac or TOBC. Patterned first coating 100 is formed by coating substrate 110 with a resist solution, prebaking the resist, irradiating the resist through a mask, and developing the resist with an aqueous alkali developer.

Figure 2:
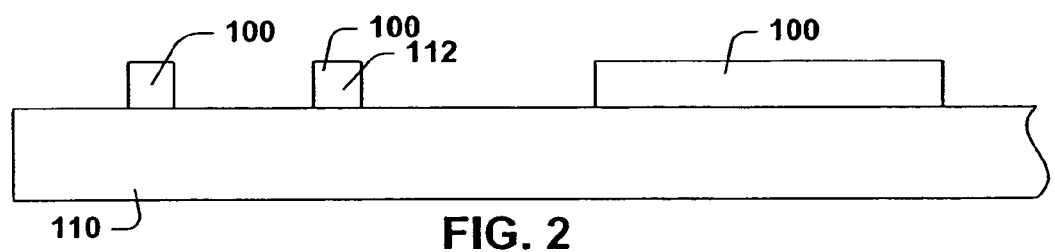
FIG. 2 is a cross-sectional illustration of the coated substrate of FIG. 1 after trimming according to one aspect of the present invention.

FIG. 2 illustrates patterned first coating 100 after trimming. In this example, trimming is carried out with plasma or reactive ion etching using oxygen and optionally an inert gas. Trimming thins and narrows the features of patterned coating 100 to about half their original size. For example, the width of feature 112, which is a line, is narrowed from a width of about 0.5 µm to a width of about 0.25 µm.

Prior to application of the second coating, patterned first coating 100 is irradiated with actinic radiation rendering patterned first coating 100 soluble in aqueous base. In the case where patterned first coating 100 is TOBC, irradiation renders the coating insoluble in non-polar organic solvent.

Figure 3:
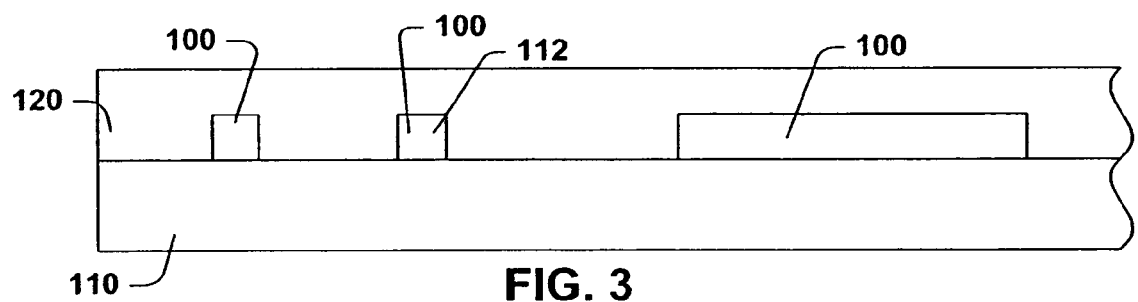
FIG. 3 is a cross-sectional illustration of the coated substrate of FIG. 2 after coating with a second coating material according to one aspect of the present invention.

FIG. 3 illustrates second coating material 120 covering the exposed portions of substrate 110 and patterned first coating 100. In this example, second coating 120 is a dry-etch resistant material, for example polysiloxane of a fluoropolymer. Second coating 120 is applied by spin coating a monomer or oligomer suspension or solution in an acidic aqueous or non-polar organic solvent system. For example, a polysiloxane coating may be formed by spin coating with an aqueous solution of silanols containing an acid catalyst followed by soft baking.

Figure 4:
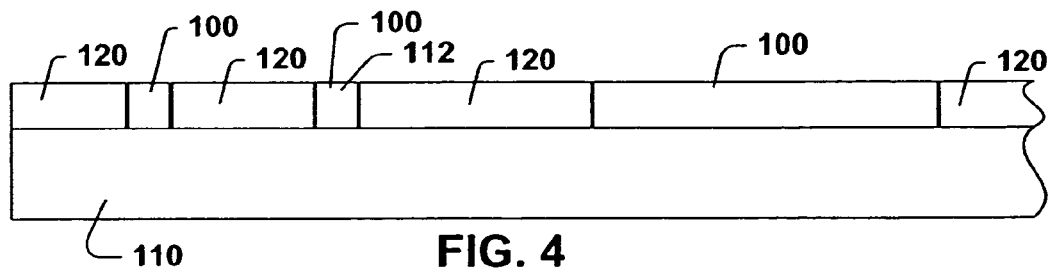
FIG. 4. is a cross-sectional illustration of the coated substrate of FIG. 3 after a planarization step according to one aspect of the present invention.

FIG. 4 shows the coated substrate 110 after a planarizing step in which patterned first coating 100 is exposed by removing the uppermost layer of second coating 120. In this example, planarization of second coating 120 with patterned first coating 100 is accomplished by mechanical polishing. After planarization, second coating 120 forms the inverse pattern of patterned first coating 100, but with feature sizes reduced by about 50% as compared to the original first coating pattern.

Figure 5:
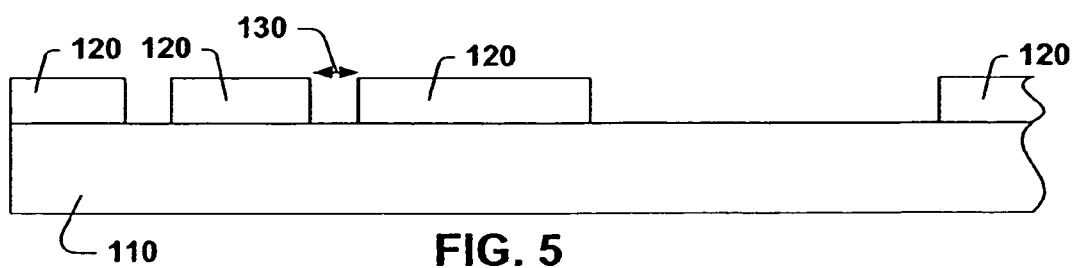
FIG. 5 is a cross-sectional illustration of the coated substrate of FIG. 4 after the patterned first coating has been removed according to one aspect of the present invention.

FIG. 5 illustrates substrate 100 with patterned second coating 120 after removal of patterned first coating 100. Patterned first coating 100 is removed by treatment with an aqueous base. The aqueous base has essentially no detrimental effect on patterned second coating 120. Patterned second coating 120 has gap 130, which is only about 0.25 µm wide. Gap 130 is sub-lithographic with respect to a novolac resist patterned first coating.

Example II

This example uses the procedures of Example I, except for the following: The first coating is positive tone resist having a non-polar organic solvent developer, PMMA or POS for example. The patterned first coating is not irradiated with actinic radiation until after the planarization step. After irradiation, the second coating is removed with a xylene developer.

In this example, an alternative for the second coating material is a positive tone photoresist, such as a novolac or TOBC. If TOBC is the second coating material, it is irradiated with actinic radiation prior to removal of the patterned first coating.

Example III

Figure 6:
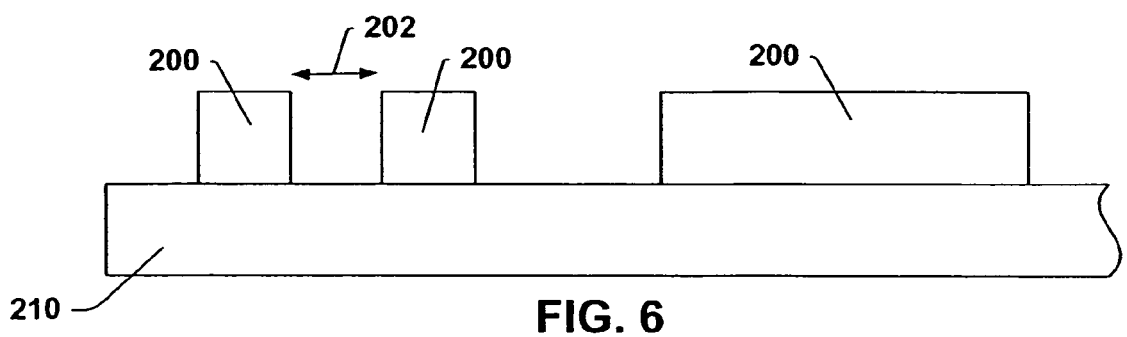
FIG. 6 is cross-sectional illustration of another substrate with a patterned first coating according to one aspect of the present invention.

A process according to another aspect of the invention is illustrated in FIGS. 6 to 9. FIG. 6 shows a patterned first coating 200 formed on substrate 210. Patterned first coating 200 is also a positive tone resist that has an aqueous alkali developer, for example, a novolac or TOBC. Patterned first coating 200 is formed by coating substrate 210 with a resist solution, prebaking the resist, irradiating the resist through a mask, and developing the resist with an aqueous alkali developer.

Prior to application of the second coating, patterned first coating 200 is irradiated with actinic radiation rendering it soluble in aqueous base. In the case where patterned first coating 200 is TOBC, irradiation renders the coating insoluble in non-polar organic solvent.

Figure 7:
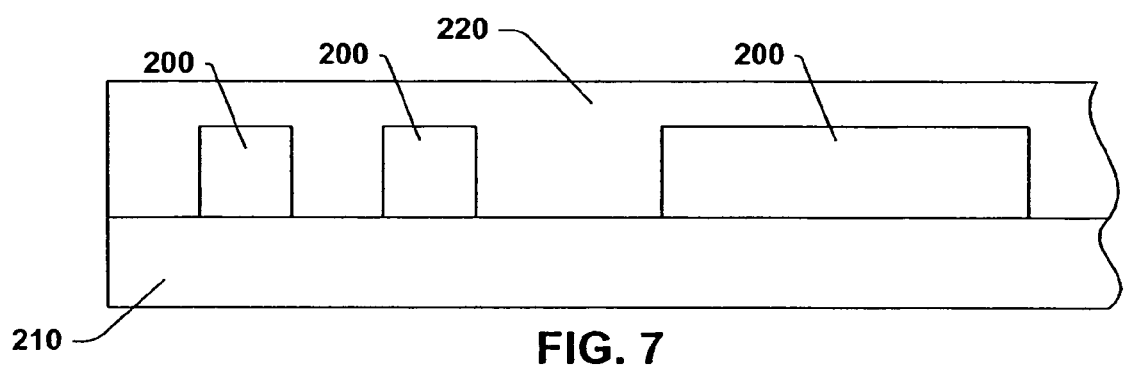
FIG. 7 is a cross-sectional illustration of the coated substrate of FIG. 6 after coating with a second coating material according to one aspect of the present invention.

FIG. 7 illustrates second coating material 220 covering the exposed portions of substrate 210 and patterned first coating 200. In this example, second coating 220 is another positive tone resist. Second coating 220 may be a novolac, TOBC, PMMA, or POS. Although both the first and second coatings may be of the same type, e.g., both novolac or both PBS, they have differing solubilities because at this point only the first coating has been exposed to actinic radiation. Second coating 120 is applied by spin coating a monomer or oligomer suspension or solution in an acidic aqueous or non-polar organic solvent system.

Figure 8:
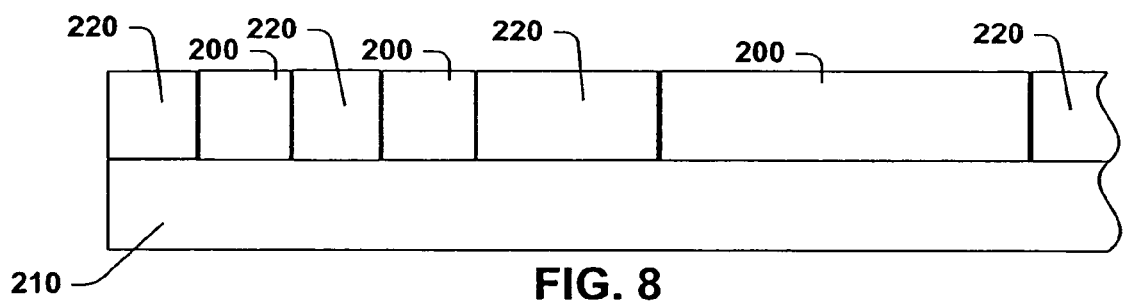
FIG. 8. is a cross-sectional illustration of the coated substrate of FIG. 7 after a planarizing step according to one aspect of the present invention.

FIG. 8 shows the coated substrate 210 after a planarizing step in which patterned first coating 200 is exposed by removing the uppermost layer of second coating 220. In this example, planarization of second coating 220 with patterned first coating 200 is accomplished by chemical mechanical polishing. After planarization, second coating 220 forms the inverse pattern of patterned first coating 200.

Figure 9:
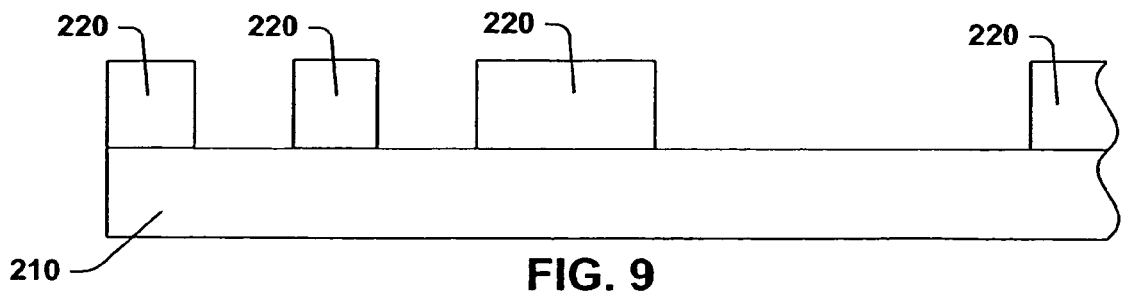
FIG. 9 is a cross-sectional illustration of the coated substrate of FIG. 8 after the patterned first coating has been removed according to one aspect of the present invention.

FIG. 9 illustrates substrate 200 with patterned second coating 220 after removal of patterned first coating 200. Patterned first coating 200 is removed by treatment with an aqueous base. The aqueous base has little or no effect on patterned coating 220.

Example IV

This example uses the procedures of Example III, except for the following: The first coating is PMMA or POS. The patterned first coating is not irradiated with actinic radiation until after the planarization step. After irradiation, the second coating is removed with a xylene developer. A novolac or TOBC could alternatively be used as the second coating material for this example. If TOBC is the second coating material, it is irradiated with actinic radiation prior to removal of the patterned first coating.

Example V

Figure 10:
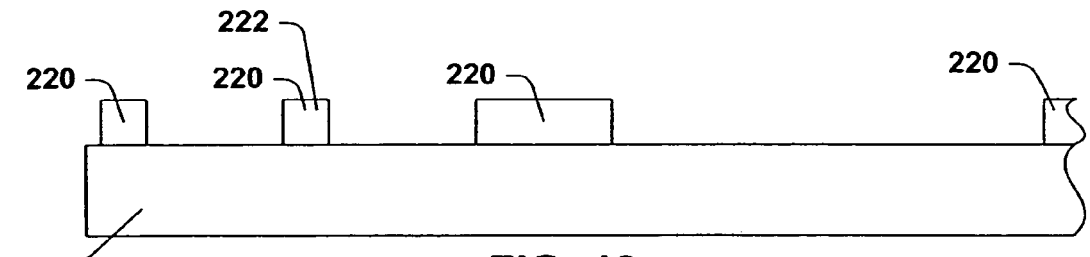
FIG. 10 is a cross-sectional illustration of the coated substrate of FIG. 9 after the patterned coating has been trimmed according to one aspect of the present invention.

Another process according to an aspect of the invention is illustrated by FIGS. 6 to 13. The process begins with the process of Example III or the process of Example IV to produce substrate 210 with patterned second coating 220 as illustrated in FIG. 9. In this example, the patterned second coating is a novolac or TOBC. The patterned second coating is trimmed to reduce the feature size. FIG. 10 illustrated patterned second coating 220 after trimming. In this example, trimming is carried out with plasma or reactive ion etching using oxygen and optionally an inert gas. Trimming thins and narrows the features of patterned coating 220 to about half their original size. For example, the width of feature 222, which is a line corresponding to gap 202 in the first coating, is narrowed from a width of about 0.5 µm to a width of about 0.25 µm.

Second coating 220 is then irradiated with actinic radiation rendering patterned second coating 220 soluble in aqueous base.

Figure 11:
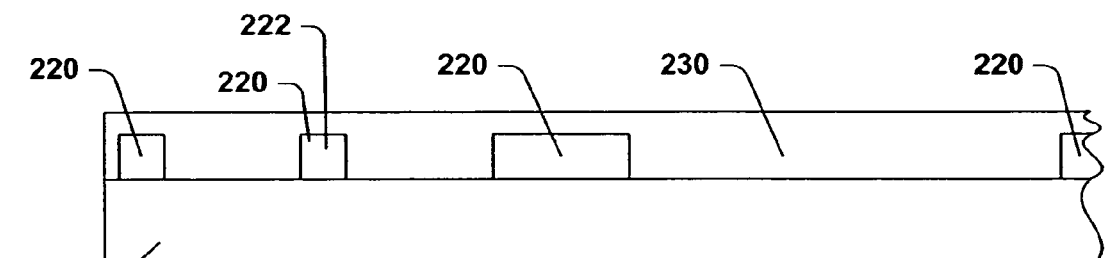
FIG. 11 is a cross-sectional illustration of the coated substrate of FIG. 10 after coating with a third coating material according to one aspect of the present invention.

FIG. 11 illustrates substrate 210 and patterned second coating 220 after application of a third coating 230, which covers patterned second coating 220 and the exposed portions of substrate 210. In this example, third coating 230 is a dry-etch resistant material, for example polysiloxane of a fluoropolymer. Third coating 230 is applied by spin coating a monomer or oligomer suspension or solution in an acidic aqueous or non-polar organic solvent system. For example, a polysiloxane coating may be formed by spin coating with an aqueous solution of silanols containing an acid catalyst followed by soft baking.

Figure 12:
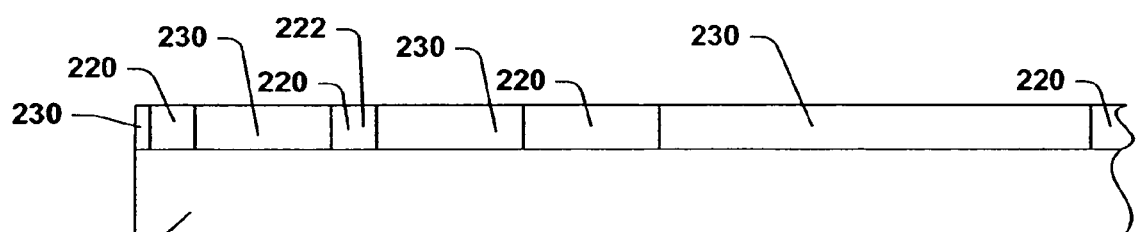
FIG. 12. is a cross-sectional illustration of the coated substrate of FIG. 11 after a planarization step according to one aspect of the present invention.

FIG. 12 shows the coated substrate 210 after a planarizing step in which patterned second coating 220 is exposed by removing the uppermost layer of third coating 230. In this example, planarization of third coating 230 with patterned second coating 220 is accomplished by mechanical polishing. After planarization, third coating 120 forms the inverse pattern of patterned second coating 220. The pattern of third coating 230 is similar to that of the patterned first coating, but with smaller features.

Figure 13:
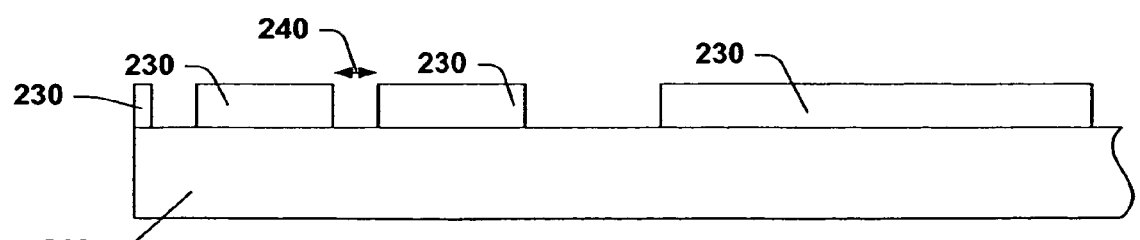
FIG. 13 is a cross-sectional illustration of the coated substrate of FIG. 12 after the patterned second coating has been removed according to one aspect of the present invention.

FIG. 13 illustrates substrate 210 with patterned third coating 230 after removal of patterned second coating 220. Patterned second coating 220 is removed by treatment with an aqueous base. The aqueous base has essentially no effect on patterned third coating 230. Patterned third coating 230 has gap 240, which is only about 0.25 µm wide. Gap 130 is sub-lithographic with respect to a novolac resist patterned first coating.

Example VI

Another process according to an aspect of the invention is illustrated by FIGS. 6 to 9 and FIGS. 14-16. This process begins with the process of Example III or the process of Example IV to produce substrate 210 with patterned second coating 220 as illustrated in FIG. 9. In this example, the patterned second coating is PMMA or POS.

Figure 14:
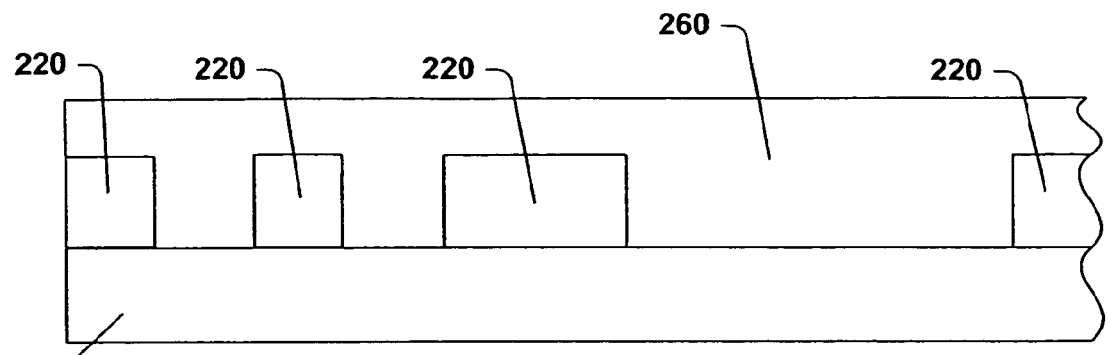
FIG. 14 is a cross-sectional illustration of the coated substrate of FIG. 9 after coating with a third coating material according to one aspect of the present invention.

FIG. 14 illustrates substrate 210 and patterned second coating 220 after application of a third coating 230, which covers patterned second coating 220 and the exposed portions of substrate 210. In this example, third coating 230 is a dry-etch resistant material, for example polysiloxane of a fluoropolymer. Third coating 230 is applied by spin coating followed by soft baking.

Figure 15:
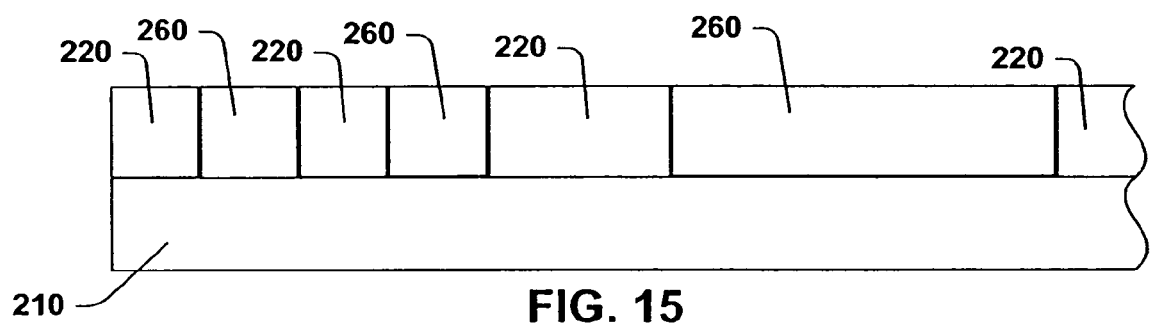
FIG. 15. is a cross-sectional illustration of the coated substrate of FIG. 14 after a planarization step according to one aspect of the present invention.

FIG. 15 shows the coated substrate 210 after a planarizing step in which patterned second coating 220 is exposed by removing the uppermost layer of third coating 230. In this example, planarization of third coating 230 with patterned second coating 220 is accomplished by mechanical polishing. After planarization, third coating 120 forms the inverse pattern of patterned second coating 220.

Figure 16:
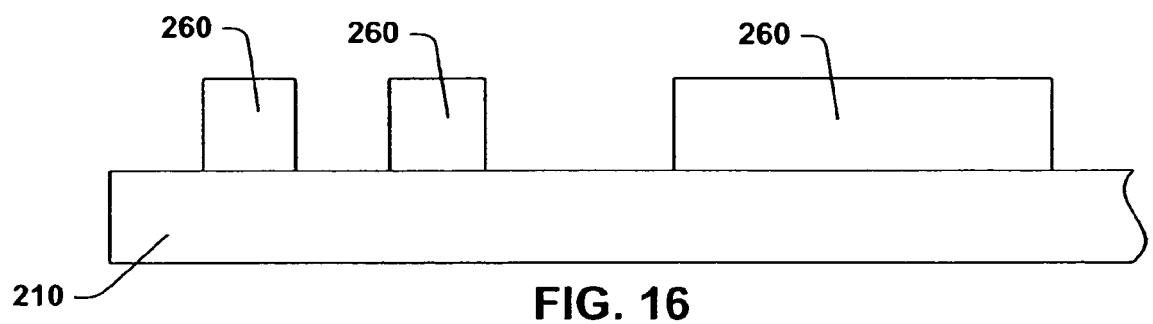
FIG. 16 is a cross-sectional illustration of the coated substrate of FIG. 15 after the patterned second coating has been removed according to one aspect of the present invention.

FIG. 16 illustrates substrate 210 with patterned third coating 230 after removal of patterned second coating 220. Patterned second coating 220 is removed by treatment with actinic radiation followed by development. The developer may be methylisobutyl ketone/isopropanol, for example. The pattern of third coating 230 is similar to that of the first coating, but has higher dry etch resistance.

Figure 17:
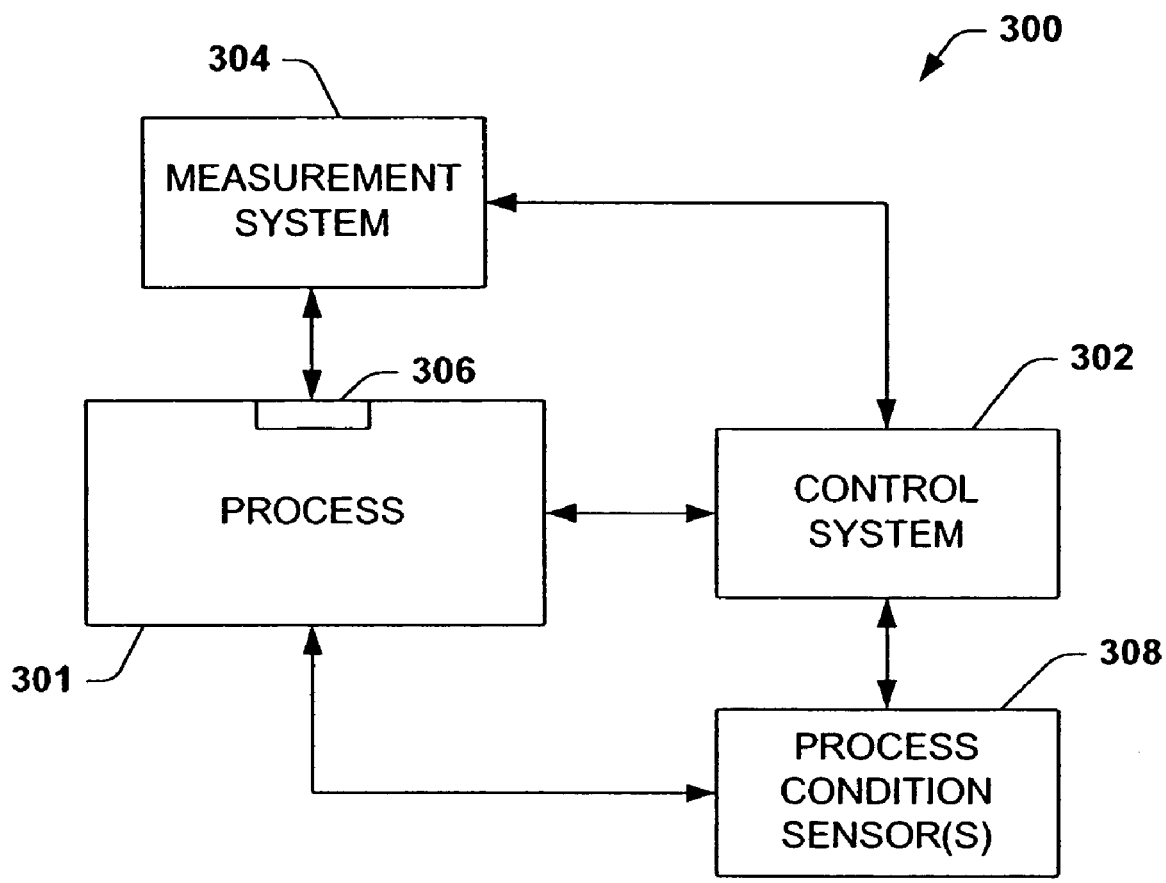
FIG. 17 is a diagramatic block representation of a system in accordance with one aspect of the present invention.

The present invention further relates to systems for making and/or using the patterned coatings having reduced feature sizes. FIG. 17 illustrates a system 300 for making and/or using the patterned coatings having reduced feature sizes in a semiconductor process, schematically indicated at 301. The process 301, for example, includes monitoring resist development, coating or developer deposition, CMP, and/or etching. For example, the system 300 may be employed for a trim etch using the patterned coatings having reduced feature sizes made in accordance with the present invention. The system 300 may also be employed for depositing or developing the first coating, dispensing the second coating, CMPing any coating, removing the first coating, and inspecting the critical dimensions of the patterned first and/or second coatings in accordance with the present invention.

The system 300 also includes a control system 302 for controlling operating characteristics of the process 301. The operating characteristics associated with the process 301 may include one or more of, for example, the temperature, concentration of developer components, concentration of etch plasma/solution components, CMP parameters, deposition components, pattern characteristics, and timing parameters associated with different steps in the patterning process. The control system 302 may adjust one or more selected operating parameters of the process based on sensed operating conditions associated with the process 301.

A measurement system 304 is operatively associated with the process 301 to measure in-situ operating characteristics. That is, the measurement system 304 may include a thickness monitoring portion 306, which may be located within (or be integrated into) the process 301, such as may include an enclosed processing chamber. The measurement system 304, for example, samples the thickness or other operating characteristic of making and/or using the patterned coatings having reduced feature sizes on the substrate at one or more locations, such as near the center and near one or more edge locations of the substrate. In particular, it may be desirable to obtain measurements from two or more spaced apart locations, such as at the center and one or more edge positions. Such measurements may enable a better determination as to uniformity of the operating characteristic, which in accordance with an aspect of the present invention, may be employed to adjust the in situ process to achieve a desired characteristic.

The measurement system 304 may implement any known technique operable to measure the operating characteristic in the process 301. Examples of techniques that may be utilized in accordance with an aspect of the present invention include scatterometry, ellipsometry, UV/vis spectrophotometry, x-ray reflectometry, and the like.

By way of further illustration, scatterometry may be employed to extract information about a surface of a substrate upon which an incident light has been directed. One or more gratings may be located on a substrate. Such gratings may be formed on the substrate, for example, at the same stage in patterning when alignment markers are formed thereon, such as by etching. Light reflected, and/or passed through, the one or more gratings and/or features is collected by one or more light detecting components of the measurement system 304. It is to be appreciated that any suitable scatterometry system may be employed to carry out the present invention, and such systems are intended to fall within the scope of the claims.

Those skilled in the art will understand and appreciate other techniques that also could be employed for performing in-situ operating characteristics measurements, all of which are contemplated as falling within the scope of the present invention. The particular technique utilized in the system 300 may further vary according the type of first or second resist, type of CMP, or type of etch process in the process 301.

The measurement system 304 is coupled to the control system 302 for providing a signal indicative of the measured operational characteristic of the process 301. The control system 302, for example, includes memory (not shown) for storing a target operational characteristic, which may vary according to the process. For example, by examining a signal (signature) library of intensity/phase signatures, a determination can be made concerning the properties of the surface, such as the decreasing thickness of portions of a coating or pattern. The control system 302 may be programmed and/or configured to compare the measured operational characteristics relative to the target operational characteristics and determine what action (if any) should be taken to drive the process 301 so that a target operational characteristic, such as thickness and/or a desired operational characteristic such as level of uniformity of thickness may be achieved.

The system 300 further may include one or more other process sensors 308 for monitoring process operating conditions and providing an indication of such conditions to the control system 302. The control system 302 thus is able to adjust process some or all operating characteristics based on one measured operating characteristic (e.g., based on a signal from the measurement system 304) and the sensed process operating conditions (e.g., based on a signal from the other process sensors 308). In this way, the control system 302 may selectively refine the patterning process 301 to accommodate variations in sensed process conditions and measured thickness at various stages of the film patterning process. For example, the control system 302 may adjust developer or etch plasma/solution flow rates, contact times, and/or temperature, based on the conditions monitored by the measurement system 304 and the sensor(s) 308. As a result, the system 300 is capable of achieving a more precise and/or uniform patterns without an increase in process steps to refine the process.

Figure 18:
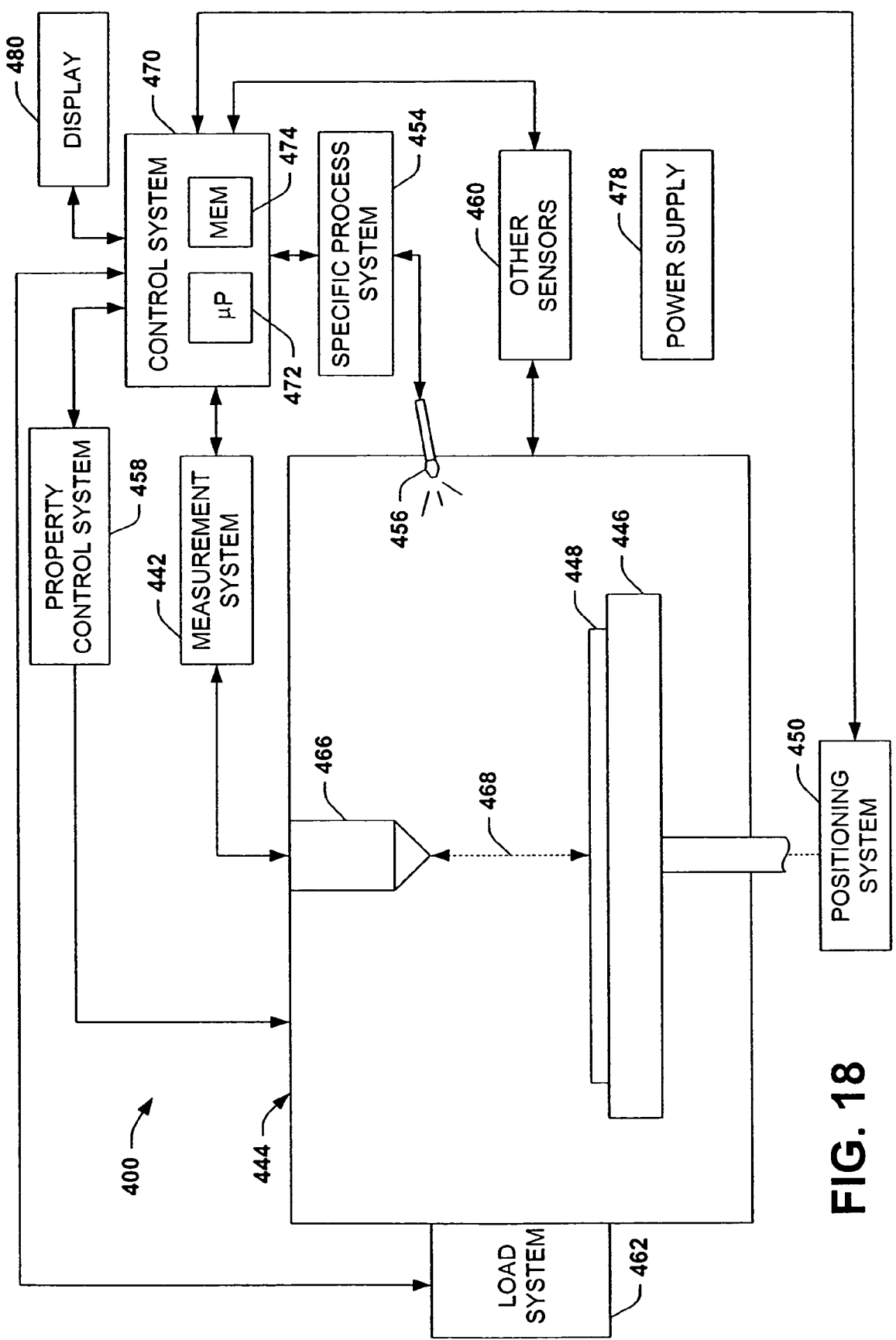
FIG. 18 is a functional block diagram of a system in accordance with another aspect of the present invention.

FIG. 18 illustrates another example of a system 400 having a measurement system 442 for in-situ monitoring of making and/or using the patterned coatings having reduced feature sizes in accordance with an aspect of the present invention. The system 400 includes a process chamber 444 that includes a support, such as may include a stage 446 (or chuck) operative to support a substrate 448, such as a wafer. A positioning system 450 is operatively connected to the support 446 for positioning the stage 446 at a desired position within the chamber 444. It is to be appreciated that wafer positioning systems are rapidly evolving and that any such system may be employed in accordance with an aspect of the present invention.

A specific process system 454 is operably coupled to the chamber 444 for selectively providing the materials to pattern a coating, dispense a coating, CMP a coating, or etch or remove a material on the substrate 448. By way of illustration, the dispensing system 454 includes a source of at least one dispense, developer and/or etch plasma/solution.

A property control system 458 also is provided for controlling properties within the processing chamber 444. For example, the property control system 458 controls the temperature, atmosphere (gases and/or actinic radiation and the like), pressure, and the like. The property control system 458 may implement its own control process or such control may be implemented as part of other sensors 460 operatively associated with the processing chamber 444.

The system 400 also may include a load system 462 operatively connected to the chamber 444 for loading and unloading substrates (e.g., wafers) into and out of the processing chamber. The load system 462 typically is automated to load and unload the wafers into the chamber at a controlled rate.

The measurement system 442 is operative to measure an operating parameter in-situ such as film thickness, in accordance with an aspect of the present invention. The measurement system 442 is a non-destructive optical measurement system, such as may utilize one or more of scatterometry, ellipsometry, UV/vis spectrophotometry, x-ray reflectometry and like techniques. The measurement system 442 typically includes a beam source and detector, schematically collectively indicated at 466. The beam source/detector 466 is located above the substrate 448. The source portion provides a light beam 468 toward an exposed surface of the substrate 448 at which the surface is being processed. The reflected beam(s) 468, which is received at the detector portion of the source/detector 466, has beam properties (magnitude and/or phase) which may be employed to determine an indication of an operating parameter. A plurality of incident beams from one or more sources also may be directed at different spaced apart locations of the substrate to obtain corresponding measurements of the operating parameter such as thickness substantially concurrently during the process. The concurrent measurements, in turn, provide an indication of the uniformity of operating parameter across the substrate.

For the example of thickness, and optical interference, the intensity of light over a selected wavelength varies as a function of thickness. For spectroscopic ellipsometry, thickness varies based on the state of polarization of light reflected from the surface of the substrate, which is functionally related to the index of refraction of the material reflecting the beam 468.

By way of further illustration, the substrate 448 has gratings formed thereon, such as may be formed concurrently with alignment markings on the substrate. The gratings, for example, may range from about 10×10 μm to about 100×100 μm, such as depending on the type of measurement tool being employed. The measurement system, in turn, may employ a scatterometry technique using spectroscopic ellipsometry to measure an operating characteristic being processed at the gratings. Thus, the measurement system 442 may measure properties of the wafer at opposed sides of the substrate 448 and near the center.

Using a scatterometry technique, for example, desired information concerning patterning/thickness can be extracted by comparing the phase and/or intensity (magnitude) of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed, including patterning/thickness.

Different combinations of the above-mentioned properties will have different effects on the phase and/or intensity of the incident light resulting in substantially unique intensity/phase signatures in the complex reflected and/or diffracted light. The measurement system 442 provides information indicative of the measured properties to a control system 470. Such information may be the raw phase and intensity information. Alternatively or additionally, the measurement system 442 may be designed to derive an indication of an operating characteristic based on the measured optical properties and provide the control system 470 with a signal indicative of the measured operating characteristic according to the detected optical properties. The phase and intensity of the reflected light can be measured and plotted.

In order to determine patterning/thickness, for example, measured signal characteristics may be compared with a signal (signature) library of intensity/phase signatures to determine properties of the surface and, in particular, concerning the thickness in a given area. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk,$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a particular type of coating having a first thickness in a first area may generate a first signature while the same type of coating having a different thickness in another area may generate a second signature, which is different from the first signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing, for example, over three hundred thousand phase/intensity signatures. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness from the signatures in the signature library. Alternatively, artificial intelligence techniques may be employed to calculate desired parameters of the wafer under test based on the detected optical properties.

While, for purposes of simplicity of illustration, the beam shown in FIG. 18 is illustrated as being generally perpendicular relative to the substrate, it is to be appreciated that the beam 468 may be oriented at other angles relative to the substrate 448 with a corresponding detector positioned at an opposite side of the substrate for receiving the reflected beam. In addition, more than one beam may be directed toward the surface at different locations to measure an operating characteristic at such different locations and, in turn, provide a measure of uniformity of the operating characteristic across the substrate. The operating characteristic of areas on the substrate 448 thus is determined based on the optical properties (e.g., n and k) of the emitted and reflected beams 468.

The other sensors 460, for example, monitor and/or measure selected conditions processing environment within the chamber 444. The other sensors 460, for example, may include a temperature sensor, mass flow sensor for gases, a pressure sensor, etc.

The various other subsystems and sensors 454, 458, 460, 462 further may provide respective signals to and/or receive control signals from the control system 470. Signals from the associated process systems 442, 454, 458, 460, 462 may indicate sensed operating conditions of the operating conditions associated with the respective systems. The control system 470 in turn analyzes the conditions indicated by the received signals to discern whether the process is being performed within expected operating parameters. The control system 470 also controls operating characteristics associated with the patterning process being implemented within the processing chamber 444 by providing appropriate control signals to the associated systems and/or sensors 442, 454, 458, 460, 462. Such control signals thus may adjust operating parameters of the patterning process when one or more detected parameters, including thickness, are not within expected operating parameters (e.g., where thickness is not uniform in a certain discrete area).

By way of example, the control system 470 includes a processor 472, such as a microprocessor or CPU, coupled to a memory 474. The processor 472 receives measured data from the measuring system 442 and corresponding other data from the other sensors 460. The processor 472 also is operatively coupled to the specific process system 454, the property control system 458, and the load station 462. The control system 470 is programmed and/or configured to control and operate the various components within the processing system 440 in order to carry out the various functions described herein.

The processor 472 may be any of a plurality of processors, such as the AMD K6, ATHLON, DURON or other processors. The manner in which the processor 472 can be programmed to carry out the functions relating to the present invention will be readily apparent to those having ordinary skill in the art based on the description provided herein.

The memory 474 serves to store program code executed by the processor 472 for carrying out operating functions of the system as described herein. The memory 474 may include read only memory (ROM) and random access memory (RAM). The ROM contains among other code the Basic Input-Output System (BIOS) which controls the basic hardware operations of the system 440. The RAM is the main memory into which the operating system and application programs are loaded. The memory 474 also serves as a storage medium for temporarily storing information such as temperature, temperature tables, etch rates, CMP properties, pattern layouts, position coordinate tables, interferometry information, thickness tables, and algorithms that may be employed in carrying out the present invention. The memory 474 also can hold patterns against which observed data can be compared as well as information concerning grating sizes, grating shapes, scatterometry information, achieved profiles, desired profiles and other data that may be employed in carrying out the present invention. For mass data storage, the memory 474 may include a hard disk drive.

A power supply 478 provides operating power to the system 400. Any suitable power supply (e.g., battery, line power) may be employed to carry out the present invention. The system further may include a display 480 operatively coupled to the control system 470 for displaying a representation (e.g., graphical and/or text) of one or more process conditions, such as thickness, patterns, etch rates, temperature, flow rates, contact time, etc. The display 480 further may show a graphical and/or textual representation of the measured optical properties (refractive index and/or absorption content) at various locations along the surface of the substrate.

As a result, the system 400 provides for monitoring process conditions, including pattern fidelity, thickness and other sensed process-related conditions, associated with the in situ making and/or using the patterned coatings having reduced feature sizes within the chamber 444. The monitored conditions provide data based on which the control system 470 may implement feedback process control so as to form a desired structure, including a uniform etching across the substrate.

What has been described above is the present invention and several of its specific embodiments. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of processing a substrate, comprising the steps of:
    forming a first coating comprising a resist material on a substrate surface, the resist material being a positive tone photoresist;
    irradiating and developing the first coating to form a patterned first coating on the substrate surface;
    forming a second coating over the substrate surface;
    planarizing the first and second coatings to make the surface of the first and second coatings co-planar;
    removing the patterned first coating while leaving the second coating to form a patterned second coating on the substrate that is approximately the negative of the pattern formed by the first coating prior to its removal; and
    using the patterned second coating as a protective layer while subjecting the substrate to further processing.

2. The method of claim 1, further comprising the step of removing the patterned second coating.

3. The method of claim 1, further comprising etching the substrate using the patterned second coating as a mask.

4. The method of claim 1, further comprising forming a third coating on the substrate surface.

5. The method of claim 4, further comprising the step of removing the patterned second coating while leaving the third coating in a pattern similar to that of the first coating.

6. The method of claim 4, further comprising etching the substrate using a patterned third coating as a mask.

7. The method of claim 6, wherein the third coating has a substantially greater dry etch resistance than the first coating.

8. The method of claim 4, further comprising etching the patterned second coating to reduce feature sizes prior to forming the third coating.

9. The method of claim 8, wherein after the patterned first coating is removed, the second coating material forms a pattern having gaps of less than about 0.5 μm.

10. The method of claim 9, wherein, after the patterned first coating is removed, the second coating material forms a pattern having gaps of less than about 0.25 μm.

11. The method of claim 4, wherein the first coating comprises a novolac.

12. The method of claim 1, wherein the second coating has a substantially greater dry etch resistance than the first coating.

13. The method of claim 1, wherein the second coating is composed primarily of organic material.

14. The method of claim 1, wherein the second coating is formed by applying a liquid solution to the substrate followed by curing.

15. The method of claim 1, wherein the second coating is spin coated on the substrate.

16. The method of claim 1, wherein the first coating comprises a novolac.

17. The method of claim 1, wherein the patterned first coating is removed by irradiating with actinic radiation followed by developing.

18. The method of claim 1, further comprising etching the patterned first coating to reduce feature sizes prior to forming the second coating.

19. A method of forming sublithographic features in a substrate, comprising the steps of:

forming a patterned first coating on a substrate by coating the substrate with a resist, the resist material being novolac, exposing the resist, and developing the resist;

etching the first coating to form a modified pattern that has features that are sublithographic for the resist;

forming a second coating over at least that portion of the substrate surface not covered by the patterned first coating;

planarizing the first and second coatings to make the surface of the first and second coatings co-planar;

removing the patterned first coating while leaving the second coating to form a pattern that is approximately the negative of the pattern formed by the first coating after etching; and etching the substrate using the second coating as a mask.

20. The method of claim 19 further comprising:

removing the patterned second coating; and forming a third coating on the substrate surface.

* * * * *